(12) United States Patent
Singleton

(10) Patent No.: US 7,959,085 B2
(45) Date of Patent: Jun. 14, 2011

(54) ELECTRONIC INLAY MODULE USED FOR ELECTRONIC CARDS AND TAGS

(75) Inventor: Robert W. Singleton, Lakeland, FL (US)

(73) Assignee: Innovatier, Inc., Lakeland, FL (US)

( * ) Notice: Subject to any disclaimer, the term of this patent is extended or adjusted under 35 U.S.C. 154(b) by 1011 days.

(21) Appl. No.: 11/697,827

(22) Filed: Apr. 9, 2007

(65) Prior Publication Data

US 2007/0235548 A1    Oct. 11, 2007

Related U.S. Application Data

(60) Provisional application No. 60/790,528, filed on Apr. 10, 2006.

(51) Int. Cl.
*G06K 19/06* (2006.01)

(52) U.S. Cl. ........................................ 235/492; 361/736

(58) Field of Classification Search .................. 235/492, 235/487, 488; 361/736, 737, 761
See application file for complete search history.

(56) References Cited

U.S. PATENT DOCUMENTS

| | | |
|---|---|---|
| 4,339,407 A | 7/1982 | Leighton |
| 4,501,787 A | 2/1985 | Marchetti et al. |
| 4,686,358 A | 8/1987 | Seckinger et al. |
| 4,751,481 A | 6/1988 | Guzik et al. |
| 4,853,692 A | 8/1989 | Wolk et al. |
| 4,961,893 A | 10/1990 | Rose |
| 5,115,223 A | 5/1992 | Moody |
| 5,135,694 A | 8/1992 | Akahane et al. |
| 5,244,840 A | 9/1993 | Kodai et al. |
| 5,350,553 A | 9/1994 | Glaser et al. |
| 5,399,847 A | 3/1995 | Droz |
| 5,416,358 A | 5/1995 | Ochi et al. |
| 5,417,905 A | 5/1995 | Lemaire et al. |
| 5,423,705 A | 6/1995 | Solomon, II |
| 5,446,265 A | 8/1995 | McAllister |
| 5,493,805 A | 2/1996 | Penuela et al. |
| 5,498,388 A | 3/1996 | Kodai et al. |
| 5,504,474 A | 4/1996 | Libman et al. |
| 5,510,074 A | 4/1996 | Rose |
| 5,512,887 A | 4/1996 | McAllister |
| 5,526,006 A | 6/1996 | Akahane et al. |
| 5,690,773 A | 11/1997 | Fidalgo et al. |
| 5,786,626 A | 7/1998 | Brady et al. |
| 5,883,576 A | 3/1999 | De La Huerga |
| 5,955,021 A | 9/1999 | Tiffany, III |

(Continued)

FOREIGN PATENT DOCUMENTS

AU    726884    12/1998

(Continued)

OTHER PUBLICATIONS

U.S. Appl. No. 11/748,413, filed May 14, 2007, Singleton et al.

(Continued)

*Primary Examiner* — Ahshik Kim
(74) *Attorney, Agent, or Firm* — Foley & Lardner LLP

(57) ABSTRACT

The disclosed electronic inlay and the method of making such an electronic inlay includes a circuit board, a plurality of circuit components attached to the circuit board, a bottom cover sheet, a top cover sheet, and a layer of thermosetting material between the bottom and top cover sheets. The electronic inlay can be used to manufacture electronic cards while using conventional equipment to apply top and bottom overlays to the electronic inlay.

44 Claims, 7 Drawing Sheets

U.S. PATENT DOCUMENTS

| | | | |
|---|---|---|---|
| 6,025,054 A | 2/2000 | Tiffany, III | |
| 6,036,099 A | 3/2000 | Leighton | |
| 6,104,295 A | 8/2000 | Gaisser et al. | |
| 6,150,921 A | 11/2000 | Werb et al. | |
| 6,161,281 A | 12/2000 | Dando et al. | |
| 6,206,291 B1 | 3/2001 | Droz | |
| 6,215,401 B1 | 4/2001 | Brady et al. | |
| 6,241,153 B1 | 6/2001 | Tiffany, III | |
| 6,255,951 B1 | 7/2001 | De La Huerga | |
| 6,256,873 B1 | 7/2001 | Tiffany, III | |
| 6,262,692 B1 | 7/2001 | Babb | |
| 6,317,102 B1 | 11/2001 | Stambeck | |
| 6,346,886 B1 | 2/2002 | De La Huerga | |
| 6,353,406 B1 | 3/2002 | Lanzl et al. | |
| 6,404,643 B1 | 6/2002 | Chung | |
| 6,459,588 B1 * | 10/2002 | Morizumi et al. | 361/737 |
| 6,483,427 B1 | 11/2002 | Werb | |
| 6,585,165 B1 * | 7/2003 | Kuroda et al. | 235/492 |
| 6,608,561 B2 | 8/2003 | Lawler, Jr. et al. | |
| 6,639,557 B2 | 10/2003 | Kamei et al. | |
| 6,693,543 B1 | 2/2004 | Stephenson et al. | |
| 6,812,824 B1 | 11/2004 | Goldinger et al. | |
| 6,888,502 B2 | 5/2005 | Beigel | |
| 6,894,615 B2 | 5/2005 | Look | |
| 6,971,200 B2 | 12/2005 | Valenti | |
| 7,197,842 B2 | 4/2007 | Ali | |
| 7,225,537 B2 | 6/2007 | Reed | |
| 7,237,724 B2 * | 7/2007 | Singleton | 235/492 |
| 7,240,446 B2 | 7/2007 | Bekker | |
| 7,573,048 B2 * | 8/2009 | Patel et al. | 250/474.1 |
| 2002/0084904 A1 | 7/2002 | De La Huerga | |
| 2002/0179721 A1 | 12/2002 | Elbaz et al. | |
| 2003/0146505 A1 | 8/2003 | Martin et al. | |
| 2003/0217210 A1 | 11/2003 | Carau | |
| 2003/0226901 A1 | 12/2003 | Kim et al. | |
| 2004/0031856 A1 | 2/2004 | Atsmon et al. | |
| 2004/0169086 A1 * | 9/2004 | Ohta et al. | 235/492 |
| 2004/0262782 A1 | 12/2004 | Ellis et al. | |
| 2005/0168339 A1 | 8/2005 | Arai et al. | |
| 2005/0199734 A1 * | 9/2005 | Puschner et al. | 235/492 |
| 2005/0276934 A1 | 12/2005 | Fukui et al. | |
| 2006/0086013 A1 | 4/2006 | Stegman et al. | |
| 2006/0145864 A1 | 7/2006 | Jacober | |
| 2006/0162156 A1 | 7/2006 | Reed | |
| 2006/0226240 A1 | 10/2006 | Singleton | |
| 2006/0273179 A1 * | 12/2006 | Yamakage et al. | 235/492 |
| 2007/0012771 A1 | 1/2007 | Singleton | |
| 2007/0290048 A1 | 12/2007 | Singleton et al. | |
| 2008/0055824 A1 | 3/2008 | Singleton et al. | |

FOREIGN PATENT DOCUMENTS

| | | |
|---|---|---|
| CA | 2289728 | 6/2001 |
| EP | 0 350 179 | 1/1990 |
| EP | 0 488 574 | 6/1992 |
| EP | 0 669 597 A1 | 8/1995 |
| EP | 0669597 A1 | 8/1995 |
| EP | 1 308 874 A | 5/2003 |
| EP | 1 780 662 A | 5/2007 |
| EP | 1 780 897 A | 5/2007 |
| EP | 1780662 A1 | 5/2007 |
| GB | 2 020 861 A | 11/1979 |
| JP | 2001-266823 A | 9/2001 |
| WO | WO 01/18981 | 3/2001 |
| WO | WO 02/076717 A2 | 10/2002 |
| WO | WO 2006/080929 | 8/2006 |
| WO | WO 2006/101493 | 9/2006 |
| WO | WO 2006/107968 A1 | 10/2006 |
| WO | WO 2007/011514 A2 | 1/2007 |
| WO | WO 2007/126748 A2 | 11/2007 |
| WO | WO 2007/149138 A1 | 12/2007 |
| WO | WO 2008/024407 | 2/2008 |

OTHER PUBLICATIONS

U.S. Appl. No. 11/872,357, filed Oct. 15, 2007, Singleton et al.
U.S. Appl. No. 12/014,412, filed Jan. 15, 2008, Keim et al.
U.S. Appl. No. 12/048,711, filed Mar. 14, 2008, Singleton et al.
U.S. Appl. No. 12/052,803, filed Mar. 21, 2008, Singleton et al.
"What is Polyurea?"http://www.pda-online.org/pda resources/whatispoly.asp, Polyurea Development Association, last visited Jan. 25, 2007.
Office Action From the Malaysian Patent Application No. PI 20070498 Dated Jan. 22, 2010 (5 pgs).
Office Action From the European Patent Application No. 07754023.5 Dated May 18, 2010 (7 pgs).
Office Action From the PRC (China) Patent Application No. 200780021427.8 Dated Aug. 4, 2010.
Order Granting Defendant's Motion for Summary Judgment on its First and Second Counterclaims, US District Court, District of Colorado, Civil Action No. 08-cv-00273-PAB-KLM, *Innovatier, Inc.*, v. *Robert Singleton*, pp. 1-19, Dec. 27, 2010.

\* cited by examiner

ELECTRONIC INLAY MODULE USED FOR ELECTRONIC CARDS AND TAGS

CROSS REFERENCE TO RELATED APPLICATIONS

This application claims priority to and the benefit of U.S. Provisional Patent Application No. 60/790,528, filed on Apr. 10, 2006 (incorporated by reference herein in its entirety).

BACKGROUND

The present invention relates generally to the field of electronic cards and, more particularly, to the field of electronic inlays used in electronic cards and the method of making such electronic inlays.

Generally, electronic cards may be used as credit cards, bankcards, ID cards, telephone cards, security cards, smart cards, or similar devices. Electronic cards are generally constructed by assembling several layers of plastic sheets in a sandwich array. Further, electronic cards contain electronic components that enable the card to perform a number of functions.

European Patent 0 350 179 discloses a smart card wherein electronic circuitry is encapsulated in a layer of plastic material that is introduced between the card's two surface layers. The method disclosed further comprises abutting a high tensile strength holding member against a side of a mold, locating the smart card's electronic components with respect to that side and then injecting a reaction moldable polymeric material into the mold such that it encapsulates the electronic components.

European Patent Application 95400365.3 teaches a method for making contact-less smart cards. The method employs a rigid frame to position and fix an electronic module in a void space between an upper thermoplastic sheet and a lower thermoplastic sheet. After the frame is mechanically affixed to the lower thermoplastic sheet, the void space is filled with a polymerizable resin material.

U.S. Pat. No. 5,399,847 teaches a credit card that is comprised of three layers, namely, a first outer layer, a second outer layer and an intermediate layer. The intermediate layer is formed by injection of a thermoplastic binding material that encases the smart card's electronic elements (e.g., an IC chip and an antenna) in the intermediate layer material. The binding material is preferably made up of a blend of copolyamides or a glue having two or more chemically reactive components that harden upon contact with air. The outer layers of this smart card can be made up of various polymeric materials, such as polyvinyl chloride or polyurethane.

U.S. Pat. No. 5,417,905 teaches a method for manufacturing plastic credit cards wherein a mold tool comprised of two shells is closed to define a cavity for producing such cards. A label or image support is placed in each mold shell. The mold shells are then brought together and a thermoplastic material is injected into the mold to form the card. The inflowing plastic forces the labels or image supports against the respective mold faces.

U.S. Pat. No. 5,510,074 teaches a method of manufacturing smart cards having a card body with substantially parallel major sides, a support member with a graphic element on at least one side, and an electronic module comprising a contact array that is fixed to a chip. The manufacturing method generally comprises the steps of: (1) placing the support member in a mold that defines the volume and shape of the card; (2) holding the support member against a first main wall of the mold; (3) injecting a thermoplastic material into the volume defined by the hollow space in order to fill that portion of the volume that is not occupied by the support member; and (4) inserting an electronic module at an appropriate position in the thermoplastic material before the injected material has the opportunity to completely solidify.

U.S. Pat. No. 4,339,407 discloses an electronic circuit encapsulation device in the form of a carrier having walls that have a specific arrangement of lands, grooves and bosses in combination with specific orifices. The mold's wall sections hold a circuit assembly in a given alignment. The walls of the carrier are made of a slightly flexible material in order to facilitate insertion of the smart card's electronic circuitry. The carrier is capable of being inserted into an outer mold. This causes the carrier walls to move toward one another in order to hold the components securely in alignment during the injection of the thermoplastic material. The outside of the walls of the carrier has projections that serve to mate with detents on the walls of the mold in order to locate and fix the carrier within the mold. The mold also has holes to permit the escape of trapped gases.

U.S. Pat. No. 5,350,553 teaches a method of producing a decorative pattern on, and placing an electronic circuit in, a plastic card in an injection molding machine. The method comprises the steps of: (a) introducing and positioning a film (e.g., a film bearing a decorative pattern) over an open mold cavity in the injection molding machine; (b) closing the mold cavity so that the film is fixed and clamped in position therein; (c) inserting an electronic circuit chip through an aperture in the mold into the mold cavity in order to position the chip in the cavity; (d) injecting a thermoplastic support composition into the mold cavity to form a unified card; (e) removing any excess material; (f) opening the mold cavity; and (g) removing the card.

U.S. Pat. No. 4,961,893 teaches a smart card whose main feature is a support element that supports an integrated circuit chip. The support element is used for positioning the chip inside a mold cavity. The card body is formed by injecting a plastic material into the cavity so that the chip is entirely embedded in the plastic material. In some embodiments, the edge regions of the support are clamped between the load bearing surfaces of the respective molds. The support element may be a film that is peeled off the finished card or it may be a sheet that remains as an integral part of the card. If the support element is a peel-off film, then any graphics elements contained therein are transferred and remain visible on the card. If the support element remains as an integral part of the card, then such graphics elements are formed on a face thereof and, hence, are visible to the card user.

U.S. Pat. No. 5,498,388 teaches a smart card device that includes a card board having a through-opening. A semiconductor module is mounted onto this opening. A resin is injected into the opening so that a resin molding is formed under such condition that only an electrode terminal face for external connection of said semiconductor module is exposed. The card is completed by mounting a card board having a through-opening onto a lower mold of two opposing molding dies, mounting a semiconductor module onto the opening of said card board, tightening an upper die that has a gate leading onto a lower die and injecting a resin into the opening via the gate.

U.S. Pat. No. 5,423,705 teaches a disc having a disc body made of a thermoplastic injection molded material and a laminate layer that is integrally joined to a disc body. The laminate layer includes an outer clear lamina and an inner white and opaque lamina. An imaging material is sandwiched between these lamina.

U.S. Pat. No. 6,025,054 discloses a method for constructing a smart card using low shrinkage glue to hold the electronic devices in place during the devices immersion in thermosetting material that becomes the core layer of the smart card.

Generally, all of the above methods involve using specialized equipment for the assembly of printed overlays that are deposited over the electronics. In view of this drawback, there is a need for the ability to present an electronic inlay that can be self-contained and capable of shipment to card manufacturing companies for incorporation into a variety of different electronic cards. In addition, there is a need for the ability to make electronic inlays that are capable of being incorporated into electronic cards through the use of conventional card making equipment in which printed overlays and laminate can be applied to the electronic inlay.

SUMMARY

According to one embodiment of the present invention, an electronic inlay used in an electronic card is provided. The electronic inlay may comprise a circuit board, a plurality of circuit components attached to the circuit board, a bottom cover sheet attached to the bottom surface of the circuit board, a top cover sheet positioned above the top surface of the circuit board, and a layer of thermosetting material between the bottom cover sheet and the top cover sheet. The overall thickness of the electronic overlay can be less than 0.033 inches or less than 0.028 inches. In addition, the overall thickness of the electronic overlay can be greater than 0.016 inches.

According to another embodiment of the present invention, an electronic card is disclosed that comprises an electronic inlay, a top overlay, and a bottom overlay. The electronic inlay may comprise a circuit board, a plurality of circuit components attached to the circuit board, a bottom cover sheet attached to the bottom surface of the circuit board, a top cover sheet positioned above the top surface of the circuit board, and a layer of thermosetting material between the bottom cover sheet and the top cover sheet. The top overlay can be attached to a top surface of the electronic inlay while the bottom overlay can be attached to a bottom surface of the electronic inlay. Additionally, a heat seal coating can be disposed on the top cover sheet and a second heat seal coating can be disposed on the bottom cover sheet.

According to another embodiment of the present invention, a method for manufacturing an electronic inlay is disclosed that comprises the steps of: providing a circuit board, affixing a plurality of circuit components to the circuit board, affixing the bottom surface of the circuit board to a bottom cover sheet, loading the circuit board and bottom cover sheet into an injection molding apparatus, loading a top cover sheet positioned above a top surface of the circuit board into the injection molding apparatus, injecting a thermosetting polymeric material between the top and bottom cover sheets, and applying a heat seal coating on the top and bottom cover sheets.

According to yet another embodiment of the present invention, a method for manufacturing an electronic card is disclosed that comprises the steps of: providing a circuit board, affixing a plurality of circuit components to the circuit board, affixing the bottom surface of the circuit board to a bottom cover sheet, loading the circuit board and bottom cover sheet into an injection molding apparatus, loading a top cover sheet positioned above a top surface of the circuit board into the injection molding apparatus, injecting a thermosetting polymeric material between the top and bottom cover sheets to make an electronic inlay, removing the electronic inlay from the injection molding apparatus, and providing a top overlay and a bottom overlay for attaching to the electronic inlay.

In one embodiment, the method of making an electronic card comprises placing the electronic inlay between the top overlay and the bottom overlay to create an assembly, placing the assembly in a laminator and performing a hot lamination process on the assembly.

According to one embodiment, an electronic inlay used in an electronic card includes a circuit board, having a top surface and a bottom surface, a plurality of circuit components attached to the top surface of the circuit board, a top cover sheet positioned above the top surface of the circuit board and a layer of thermosetting material positioned between the circuit board and the top cover sheet.

According to another embodiment, an electronic card includes an electronic inlay comprising a circuit board, having a top surface and a bottom surface, a plurality of circuit components attached to the top surface of the circuit board, a top cover sheet positioned above the top surface of the circuit board and a layer of thermosetting material between the circuit board and the top cover sheet, a top overlay attached to a top surface of the electronic inlay and a bottom overlay attached to the bottom surface of the circuit board.

According to yet another embodiment, a method for manufacturing an electronic inlay, includes providing a circuit board having a top surface and a bottom surface, affixing a plurality of circuit components onto the top surface of the circuit board, loading the circuit board into an injection molding apparatus, loading a top cover sheet positioned above a top surface of the circuit board into the injection molding apparatus, injecting a thermosetting polymeric material between the top and cover sheet and the circuit board and applying a heat seal coating on the top cover sheet and the bottom surface of the circuit board.

According to still another embodiment, a method for manufacturing an electronic card, includes providing a circuit board having a top surface and a bottom surface, affixing a plurality of circuit components onto the top surface of the circuit board, loading the circuit board into an injection molding apparatus, loading a top cover sheet positioned above a top surface of the circuit board into the injection molding apparatus, injecting a thermosetting polymeric material between the top cover sheet and the circuit board to make an electronic inlay, removing the electronic inlay and providing a top overlay and a bottom overlay for attachment to the electronic inlay.

It is to be understood that both the foregoing general description and the following detailed descriptions are exemplary and explanatory only, and are not restrictive of the invention as claimed

BRIEF DESCRIPTION OF THE DRAWINGS

These and other features, aspects and advantages of the present invention will become apparent from the following description, appended claims, and the accompanying exemplary embodiments shown in the drawings, which are briefly described below.

DETAILED DESCRIPTION OF THE PREFERRED EMBODIMENTS

Figure 1:
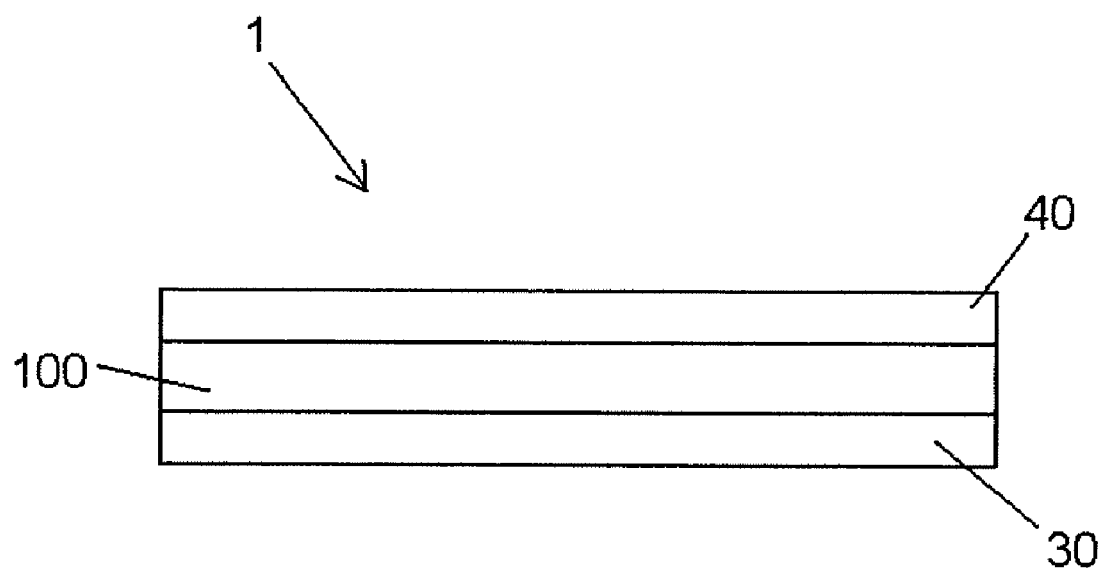
FIG. 1 shows a schematic view of an electronic card according to an embodiment of the present invention.
Figure 2:
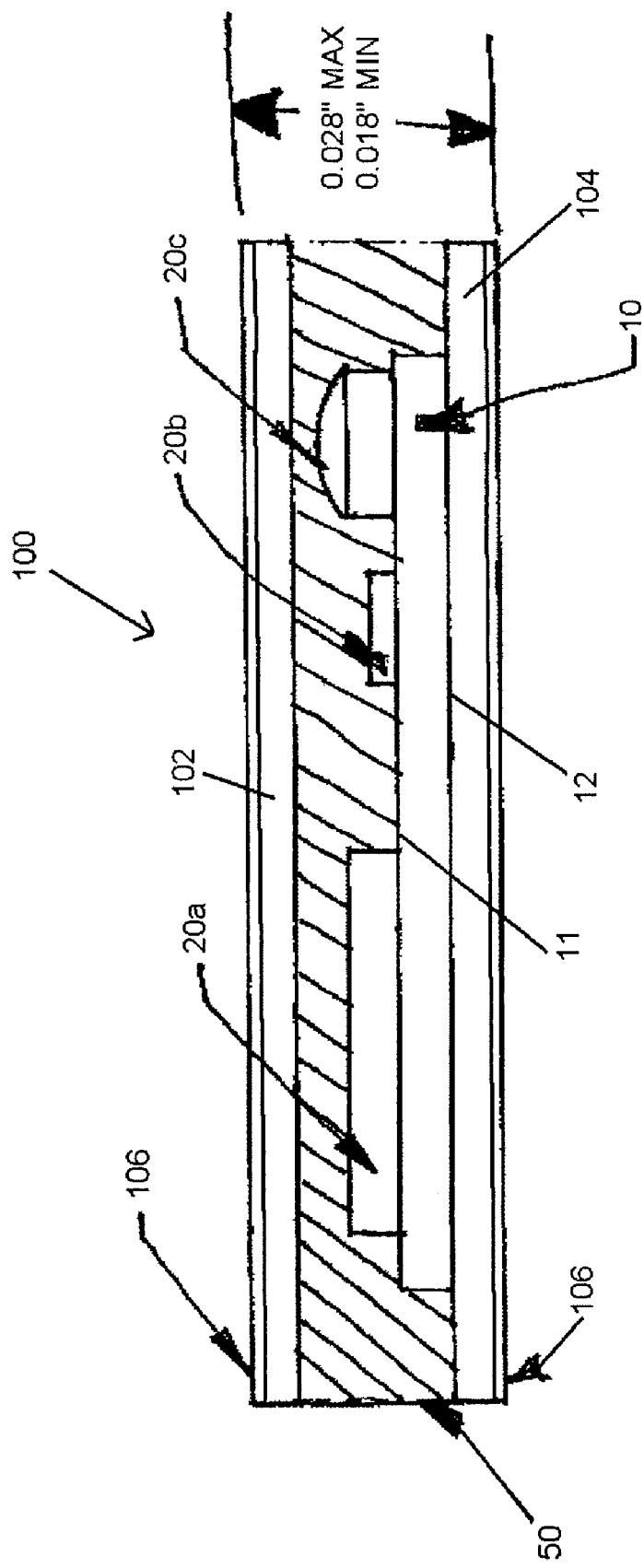
FIG. 2 shows a cross sectional view of an electronic inlay for an electronic card according to an embodiment of the present invention.

According to one embodiment of the present invention, as shown in FIG. 1, an electronic card 1 may comprise an electronic inlay 100, a bottom overlay 30, and a top overlay 40. As seen in FIG. 2, the electronic inlay 100 may comprise a circuit board 10, a plurality of circuit components 20a-20c, a layer of thermosetting material 50, a top cover sheet 102, and a lower cover sheet 104.

The circuit board 10 has a top surface 11 and a bottom surface 12. According to one embodiment of the invention, the circuit board 10 can be double-sided. Accordingly, the circuit board 10 may be configured to accommodate a plurality of circuit traces 14 (shown in FIG. 3) on the top surface 11 and on the bottom surface 12. The circuit traces 14 are configured to operably connect the plurality of circuit components 20a-20c affixed to the circuit board 10. The circuit traces 14 electrically connect to the plurality of circuit components 20a-20c such that the circuit components are capable of performing electrical functions within the electronic card 1.

The circuit traces 14 may be provided upon the surfaces 11 and 12 of the circuit board in numerous ways. For example, the circuit traces 14 may be formed on the circuit board 10 with conductive ink. In the alternative, circuit traces 14 may be etched onto the circuit board 10.

The circuit board 10 is comprised of any known conventional material suitable for receiving an electronic circuit. For example, the circuit board 10 may be comprised of a flame retardant laminate with a woven glass reinforced epoxy resin. This material is also known as FR-4 board. Alternatively, the circuit board 10 may be comprised of a plastic compound that is suitable for receiving conductive ink, such as polyester.

As shown in FIG. 2, and described below, the circuit board 10 is configured to receive and vertically stabilize a plurality of circuit components 20a-20c. The plurality of circuit components 20a-20c may be attached to the circuit board 10 and specifically to the circuit traces 14 by any one of a number of methods. For example, in one embodiment of the invention, the circuit components 20a-20c are connected to the circuit board 10 with a conductive adhesive. Preferably, the plurality of circuit components are soldered onto the circuit board 10. The plurality of circuit components 20a-20c can be positioned anywhere on the circuit board 10 as desired. The purpose of the electronic card 1 and the design parameters will dictate the position of the circuit traces 14 and the position of the circuit components 20a-20c. Functionality will also dictate what types of circuit components 20a-20c populate the circuit board 10.

Figure 4:
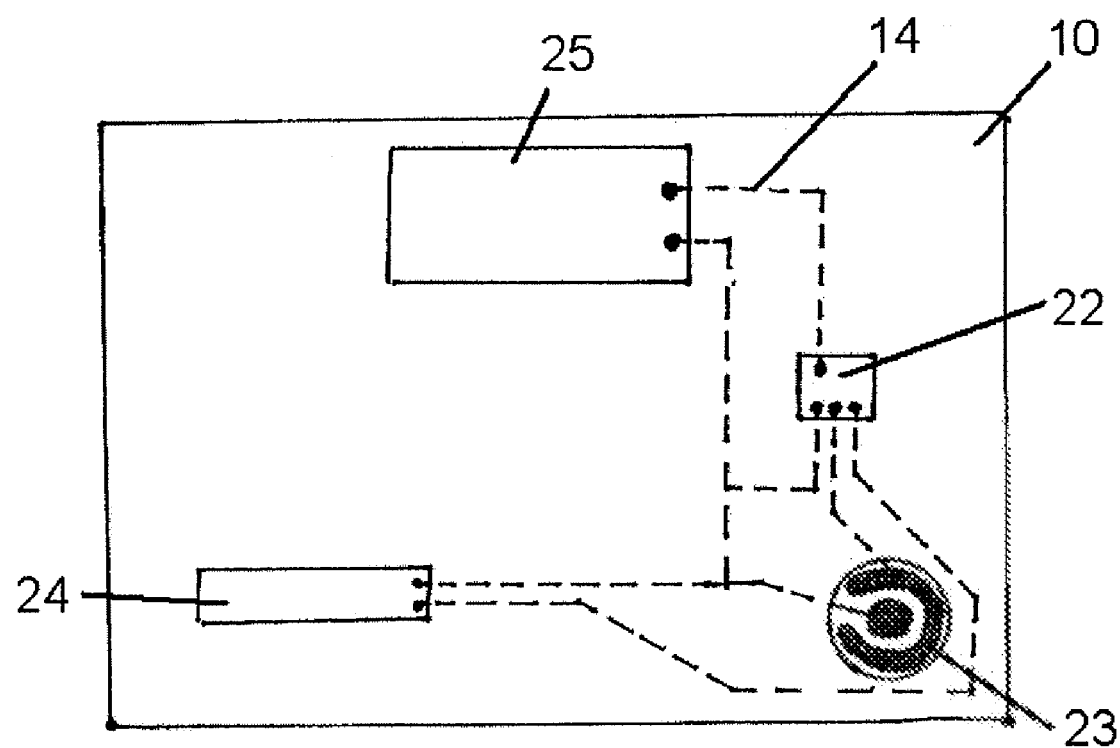
FIG. 4 shows a circuit board with circuit components attached to it according to an embodiment of the present invention.

For example purposes only, the plurality of circuit components 20a-20c could be one of a battery, an LED, a button or switch. In addition, any one or all of these circuit components could populate the circuit board 10. Further, additional circuit components 20a-20c may include but are not limited to a microprocessor chip, a speaker, a plurality of LEDs 26 (shown in FIG. 7), flexible displays, RFID antennas and emulators. Referring to FIG. 4, a circuit layout for an electronic inlay 100 is shown. The circuit board 10 shown in FIG. 4 is populated by a battery 25, a microprocessor 22, and a button 23. The electronic inlay 100 can include a liquid crystal display 24 as the circuit component connected to the button 23. The liquid crystal display 24 may be used to display information to a user, such as an account balance. In the alternative or in addition to, the electronic inlay 100 may include a speaker (not shown).

Generally, the components shown in FIG. 2 may vary in thickness and length. For example, the electronic inlay 100 can have a thickness of less than 0.03 inches. However, the overall thickness of the electronic inlay 100 is preferably between 0.016 and 0.028 inches. Accordingly, these dimensions allow the electronic inlay 100 to be compatible with the conventional equipment used by different certified financial card houses to add the bottom overlay 30 and the top overlay 40. For example purposes only, the battery 25 can have a thickness of 0.016 inches, the push button 23 can have a thickness of 0.020 inches and the microprocessor 22 has a thickness of 0.015 inches. In addition, the electronic card 1 shown in FIG. 2 could have a speaker (not shown) having a thickness of 0.010 inches.

As shown in FIG. 2, a bottom cover sheet 104 is attached to the bottom surface 12 of the circuit board 10. The bottom cover sheet 104 can be attached to the circuit board 10 by any number of known methods. Preferably, the bottom surface 12 is attached to the bottom cover sheet 104 using a pressure sensitive adhesive tape or a spray-on adhesive. The bottom cover sheet 104 may be comprised of any suitable material but preferably, the bottom cover sheet 104 is comprised of polyvinyl chloride (PVC), polyester, acrylonitrile-butadiene-styrene (ABS), polycarbonate, polyethylene terephthalate (PET), PETG, or any other suitable material. The bottom cover sheet 104 can be, for example, 0.001 to 0.002 inches thick and can include a heat seal coating 106 on the outside of the cover sheet that is compatible with PVC. The heat seal coating 106 may be compatible with PVC since the bottom overlay 30 can be made from PVC.

A top cover sheet 102 positioned above the top surface of the circuit board 10 is shown in FIG. 2. The top cover sheet 102 may be comprised of any suitable material, for example, the top cover sheet 102 may be polyvinyl chloride (PVC), polyester, acrylonitrile-butadiene-styrene (ABS), polycarbonate, polyethylene terephthalate (PET), PETG, or any other suitable material. Like the bottom cover sheet, the top cover sheet can be, for example, 0.001 to 0.002 inches thick and can include a heat seal coating 106 on the outside of the cover sheet that is compatible with PVC. The heat seal coating 106 may be compatible with PVC since the top overlay 40 can be made from PVC.

As previously mentioned, the overall thickness of the electronic inlay 100 can vary as well as the thickness of the top 102 and bottom 104 cover sheets. In addition to the examples above, other examples can include electronic cards 1 having thicknesses as low as 0.010 inches or lower and as high as 0.200 inches or higher. In addition, the top and bottom cover sheets can have thickness in the range of 0.010 inches to 0.200 inches. Thus, the overall thickness of the electronic inlay 100 and the thicknesses of the individual parts, such as the top 102 and bottom 104 cover sheets, will depend on the particular application and desired dimensions of the electronic card 1.

As shown in FIG. 2, a layer of thermosetting material 50 is positioned between the top surface of the circuit board 10 and the top cover sheet 102. In addition, the layer of thermosetting material 50 is present in an area below the bottom surface 11 of the circuit board 10 and above the bottom cover sheet 104. Preferably the layer of thermosetting material 50 is composed of a thermosetting polymeric material. For example, the layer of thermosetting material 50 can be composed of polyurea.

Polyurea is a known elastomer that is derived from the reaction product of an isocyanate component and a resin blend component. The isocyanate can be aromatic or aliphatic in nature. It can be a monomer, a polymer, or any variant reaction of isocyanates, quasi-prepolymer or a prepolymer. The prepolymer, or quasi-prepolymer, can be made of an amine-terminated polymer resin or a hydroxyl-terminated polymer resin. The resin blend must be made up of amine-terminated polymer resins, and/or amine-terminated chain extenders. The amine-terminated polymer resins will not have any intentional hydroxyl moieties. Any hydroxyls are the result of an incomplete conversion to the amine-terminated polymer resins. The resin blend may also contain additives or non-primary components. These additives may contain hydroxyls, such as pre-dispersed pigments in a polyol carrier. Normally, the resin blend will not contain a catalyst (s).

Using a polyurea formulation, such as a pure polyurea, as the layer of thermosetting material 50 allows the electronic inlay 100 to withstand the hot lamination temperatures used in the hot lamination process when the top 102 and bottom 104 overlays are added to the electronic inlay 100 to form the electronic card 1. Such hot lamination temperatures can include the range of 250 to 300° F.

Figure 7:
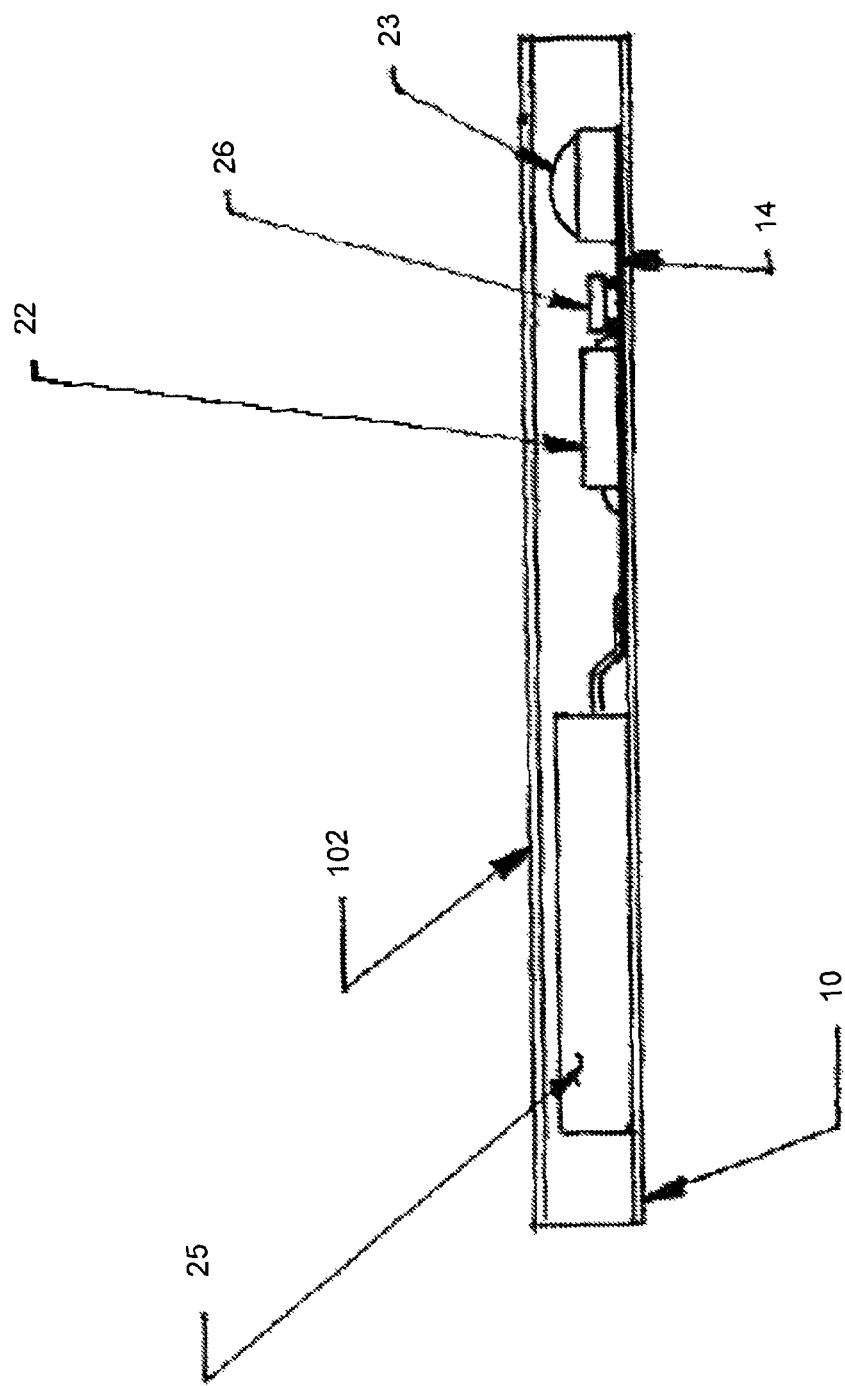
FIG. 7 shows a cross sectional view of an electronic inlay for an electronic card according to an embodiment of the present invention.

According to another embodiment, the electronic inlay 100 does not include a bottom cover sheet 104 as shown in FIG. 7. A plurality of circuit components 20a-20c are positioned on the circuit board 10. A top cover sheet 102 is positioned above the populated circuit board 10, wherein a layer of thermosetting material 50 is positioned between the bottom surface of the top cover sheet 102 and the top surface of the circuit board 10. The circuit board 10 can include a PVC compatible heat seal coating 106 applied to the bottom surface 12 of the circuit board 10. Preferably, the heat seal coating 106 may be compatible with PVC since the bottom overlay 30 can be made from PVC.

Once the injection of the layer of thermosetting material 50 is complete and the electronic inlay is ready for removal and shipping, the electronic inlay may be shipped to certified financial card houses, which will add the remaining top overlay 40 and the bottom overlay 30.

The bottom overlay 30 can be attached to the bottom surface of the heat seal coating 106 if present. If there is no heat seal coating, the bottom overlay 30 can be attached to the bottom surface of the bottom cover sheet 104 or the circuit board 10. If the heat seal coating 106 is used, it will facilitate the hot lamination process for attaching the bottom overlay 30 to the electronic inlay 100. The bottom overlay 30 may be comprised of any suitable material but preferably, the bottom overlay 30 is comprised of polyvinyl chloride (PVC) or like material. According to one embodiment of the invention, the surface of the bottom overlay 30 in contact with the heat seal coating 106 and/or in contact with the bottom cover sheet 104 or circuit board 10 has printed information. Alternatively, printed information may be placed on the outside surface of the bottom overlay 30. For example, the bottom overlay 30 may include printed information consistent with a standard credit card, including a name, expiration date, and account number.

According to another embodiment of the invention, the bottom overlay 30 may be clear or "2/5 clear/white printed." "2/5 clear/white printed" means that the overlay comprises a 0.005" printed white PVC layer with a 0.002" clear laminate over the printed surface of the 0.005" layer. Of course, other types of overlays can be used such as a printed white PVC layer that is less than 0.005" thick and/or a clear laminate layer that is less than 0.002" thick.

A top overlay 40 positioned above the top surface of the circuit board 10 is shown in FIG. 1. The top overlay 40 may be comprised of any suitable material, for example, the top overlay 40 may comprise of polyvinyl chloride (PVC) or like material. According to one embodiment of the invention, the surface of the top overlay 40 in contact with the layer of thermosetting material 50 has printed information. Alternatively, the outside surface of the top overlay 40 may have printed information. For example, the top overlay 40 may include printed information consistent with a standard credit card, including a name, expiration date and account number.

According to another embodiment of the invention, the top overlay 40 may be clear or "2/5 clear/white printed," as discussed above. As with the bottom overlay 30, other types of overlays can be used such as a printed white PVC layer that is less than 0.005" thick and/or a clear laminate layer that is less than 0.002" thick.

As previously mentioned, the overall dimensions of the electronic card 1 and the electronic inlay 100 deserve special attention. In particular for the purpose of producing a financial card that meets ISO 07816 standards, the finished card cannot exceed 0.033 inches (or 0.76 mm) in thickness. Thus, the thicknesses of the top overlay 40, the bottom overlay 30, and the electronic inlay 100 cannot be considered independent of each other. For example, if the top 40 and bottom 30 overlays both comprise 2/5 clear/white printed, then each overlay is 0.007 inches thick. Thus, the electronic inlay's 100 thickness cannot exceed 0.019 inches. If, however, the top 40 or the bottom 30 overlay is less than 0.007 inches thick, then the inlay's 100 thickness can be higher as long as the combination of the thickness of the top overlay 40, the bottom overlay 30, and the electronic inlay 100 do not exceed 0.033 inches.

Other variations of these arrangements are also contemplated. For example, instead of the use of a top cover sheet 102, a mold release could be utilized. In such a configuration, there would be circuit components disposed on a circuit board 10, the circuit board 10 would be disposed on a bottom cover sheet 104, and a layer of thermosetting material 50 disposed on the circuit components, the circuit board 10, and the bottom cover sheet 104. A mold release, such as a silicon spray, would be applied to the top of the mold to facilitate the separation of the electronic inlay from the mold. The mold release residue would be removed from the electronic inlay before the hot lamination process to add on the top and bottom overlays takes place.

A method for manufacturing an electronic card according to the present invention will now be described.

First, a circuit board 10 is provided. The circuit board 10 has a top surface 11 and a bottom surface 12. Circuit traces 14 are present on the top surface 11 of the circuit board 10. Alternatively, the circuit board may be double-sided having circuit traces 14 on the top surface 11 and the bottom surface 12.

Next, a plurality of circuit components 20a-20c are then positioned onto the circuit board 10 and electrically connected to the circuit traces 14 on the top and/or bottom surface of the circuit board 10. The circuit components 20a-20c may be connected by any one of several methods including the use of double-sided electrically conducting tape. Preferably, the plurality of circuit components 20a-20c are connected via a conventional soldering process.

Next, the bottom surface 12 of the circuit board 10 is affixed to the bottom cover sheet 104. Preferably, the bottom surface 12 is attached to the bottom cover sheet 104 using a pressure sensitive adhesive tape or a spray-on adhesive. According to another embodiment, the bottom surface 12 of the circuit board is not attached to a bottom cover sheet 104. In this embodiment, the circuit board functions as the bottom cover sheet 104.

The circuit board 10, with or without the bottom cover sheet 104 is then loaded as one complete sheet into an injection molding apparatus. A top cover sheet 102 is placed into the injection molding apparatus and positioned such that the top cover sheet 102 is above the top surface 11 of the circuit board 10. Specifically, the injection molding apparatus may be a reaction injection molding machine ("which is often individually referred to as "RIM"). These machines are associated with a top mold shell and a bottom mold shell that are capable of performing cold, low pressure, forming operations on at least one of the sheets of polymeric material (e.g., PVC) that can make up the top cover sheet 102 and the bottom cover sheet 104. Such top and bottom mold shells cooperate in ways that are well known to those skilled in the polymeric material molding arts.

Figure 5:
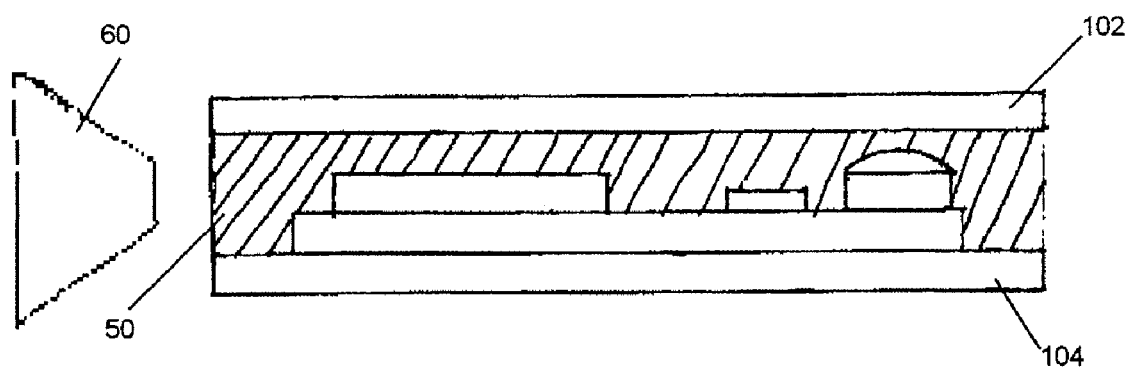
FIG. 5 shows a schematic view of an electronic inlay with a nozzle used to inject thermosetting material between the top and bottom cover sheets.

The injection molding apparatus then injects thermosetting polymeric material via a nozzle 60 (shown in FIG. 5) between the top cover sheet 102 and the circuit board 10/bottom cover sheet 104, forming the layer of thermosetting material 50 from the thermosetting polymeric material. Preferably, as mentioned above, the thermosetting polymeric material can be polyurea but other suitable materials can be used.

Cold, low pressure forming conditions generally mean forming conditions wherein the temperature of the thermosetting polymeric material, is less than the heat distortion temperature of the top cover sheet 102 and the bottom cover sheet 104/circuit board 10, and the pressure is less than about 500 psi. Preferably, the cold forming temperatures will be at least 100° F. less than the heat distortion temperature of the top cover sheet 102 and the bottom cover sheet 104/circuit board 10. The heat distortion temperature of many polyvinyl chloride (PVC) materials is about 230° F. Thus, the temperatures used to cold form such PVC sheets in the present invention will be no more than about 130° F.

According to one embodiment of the invention, the more preferred cold, low pressure forming procedures will involve injection of thermosetting polymeric materials with temperatures ranging from about 56° F. to about 160° F., under pressures that preferably range from about atmospheric pressure to about 500 psi. In another embodiment of the invention, the temperatures of the thermosetting polymeric material being injected into the electronic inlay 100 will be between about 65° F. and about 70° F. under injection pressures that preferably range from about 80 to 120 psi.

During the injection process, gates are used to allow the flow of the thermosetting material between the top and bottom cover sheets. On the other hand, no runners are used in the process, which results in a sheet of electronic inlays 100 that will be flat. It should also be noted that if the heat seal coating 106 on the top 102 and bottom cover sheets 104/circuit board 10 is used, the coating can be added at any appropriate time in the process. For example, the heat seal coating can be added before the cover sheets are inserted into the mold or after the sheet of electronic inlays is removed from the mold.

Figure 3:
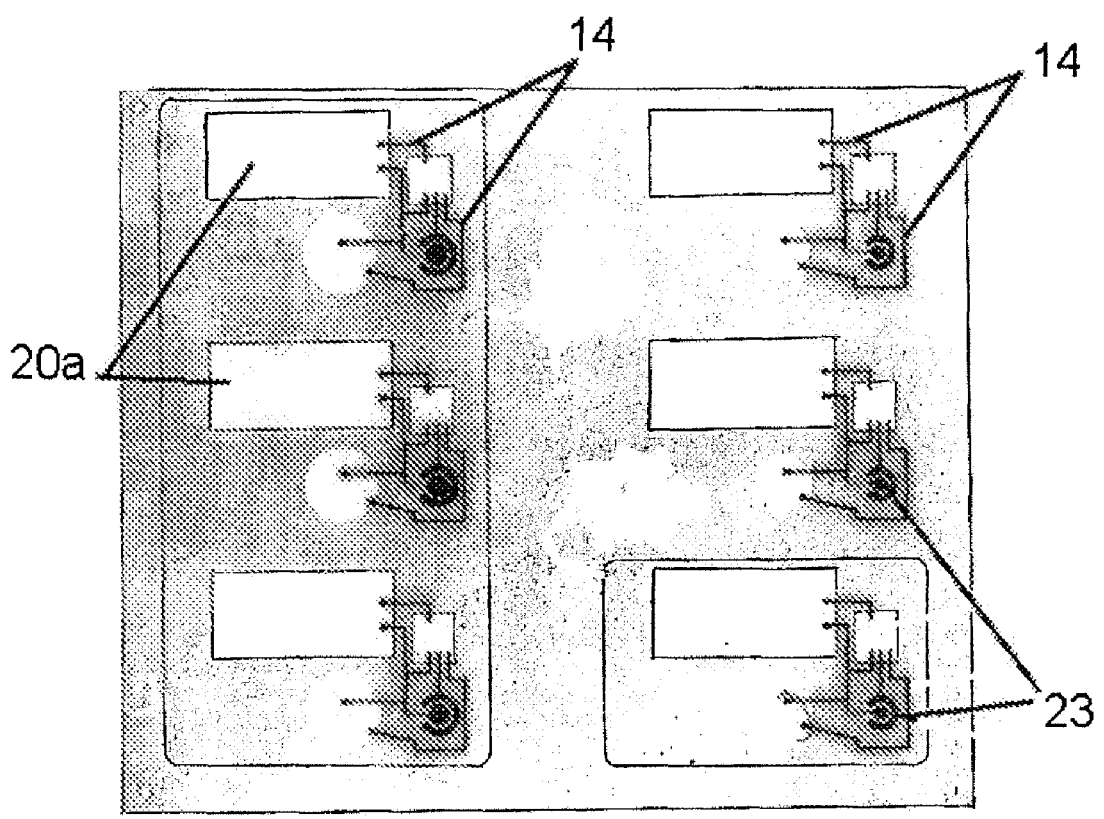
FIG. 3 shows a top view of a sheet of circuit boards for use in making electronic inlays according to an embodiment of the present invention.

After the injection of the thermosetting polymeric material, the molded structure is then removed from the injection molded apparatus. According to one embodiment of the invention, several electronic inlays 100 are formed on one molded sheet. FIG. 3 depicts several electronic inlays formed on one sheet. According to other embodiments, the injected sheet can correspond to a single electronic inlay 100, a single strip or row of electronic inlays 100, or an array of electronic inlays. For example, the injected sheet can include three rows of seven electronic inlays, which can allow existing card manufacturers to produce electronic cards using their existing equipment and processes that they use today. The stiffness of the electronic inlay 100 will depend upon the materials used in the composition of each of the individual components of the electronic inlay 100.

The sheet of the electronic inlays 100 is then removed. Next, a top 40 and bottom 30 overlay is applied to the electronic inlay 100 to form an electronic card/tag 1. For example, card manufacturers may receive the sheets of electronic inlays 100 and use a hot lamination process to attach the top 40 and bottom 30 overlays to the electronic inlay. The use of the heat seal coating can facilitate the hot lamination process to attach the overlays. In addition, the heat seal coating can be PVC compatible in the instance where PVC material is used for top 40 and bottom 30 overlays. The hot lamination process can operate in the temperature range of about 250° F. to about 320° F. For this reason, pure polyurea may be desirable since it can withstand such temperatures.

Figure 6:
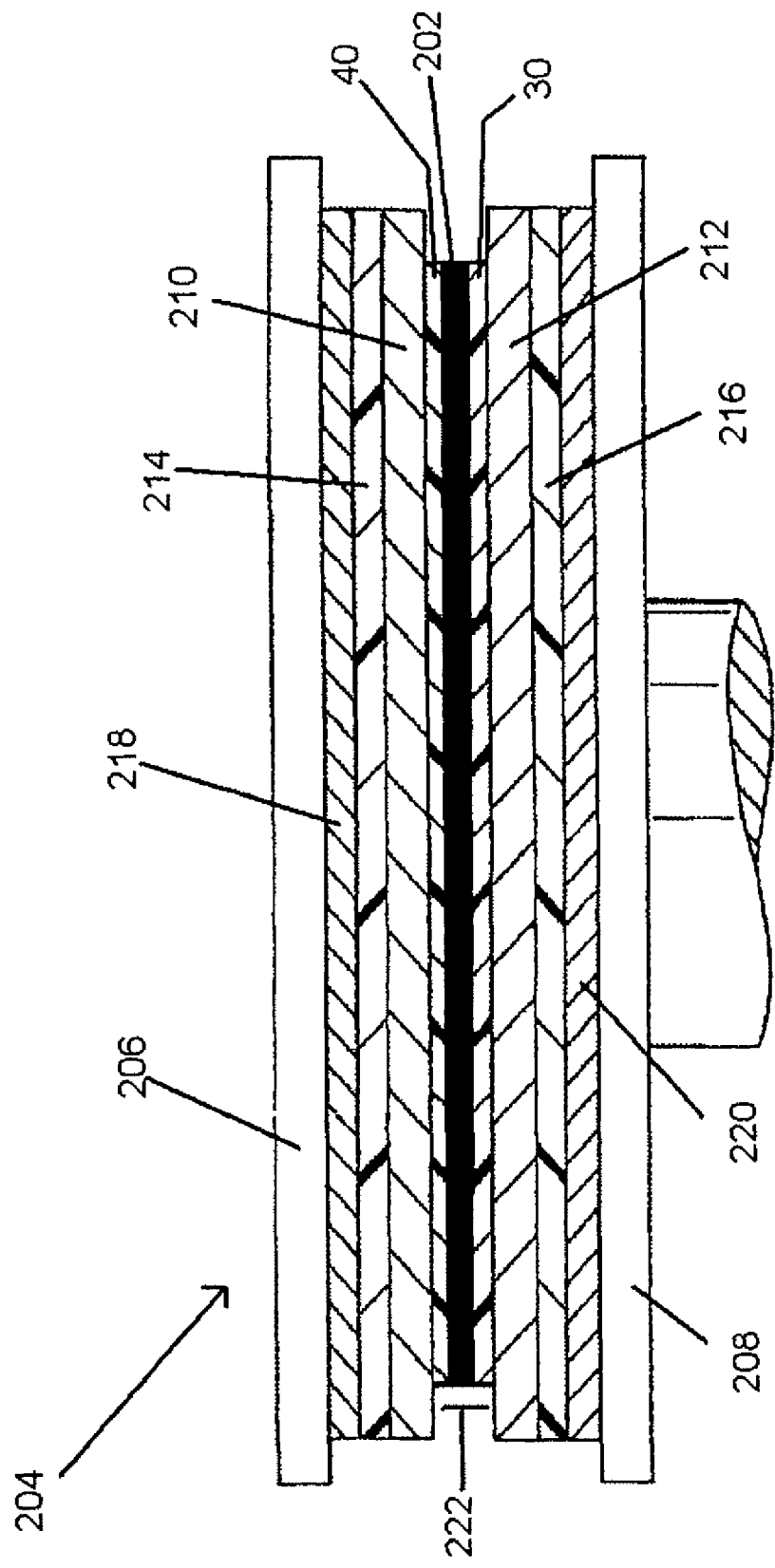
FIG. 6 shows a cross sectional view of an assembly comprising an electronic inlay, a top overlay, and a bottom overlay in a laminator according to an embodiment of the present invention.

An example of a hot lamination process that can be used is presented in U.S. Pat. No. 5,817,207, which is incorporated by reference herein. An example of such a process is presented in FIG. 6. In this example, the sheet of electronic inlays 202 is placed between the top and bottom overlays 40 and 30. These layers are placed in a laminator 204 of the type well known in the art of plastic card manufacturing. The laminator 204 includes upper and lower platens 206 and 208 for applying ram pressure to an article positioned therebetween. In addition to the ability to apply ram pressure, the controlled platens 206 and 208 may provide both heat and chill cycles and can include a cycle timer to regulate cycle time. The sheet of inlays 202 and the top and bottom overlays 40 and 30 form an assembly 222 that is positioned between the first and second laminating plates 210 and 212, one of which can have a matte finish to provide at least one textured outer surface to either the top or bottom overlay. In addition, there are first and second laminating pads 214 and 216 positioned outside of the laminating plates 210 and 212 and first and second steel plates 218 and 220 positioned outside of the laminating pads 214 and 216. The assembly 222 is shown to be in position between platens 206 and 208 in FIG. 6.

Once the assembly 222 is in position in the laminator 204, the first lamination cycle is initiated by closing the platens 206 and 208, preferably applying little or no ram pressure to the assembly 222. A heat cycle is initiated, bringing the temperature of the platens 206 and 208 up to a range of 250° F. to 320° F. for a period of greater than 5 minutes, and preferably in the range of 7 to 10 minutes. Once the heat cycle has been applied to the assembly as is set forth above, the ram pressure of the laminator 40 is increased to facilitate the attachment of the top and bottom overlays 40 and 30 to the electronic inlays. The ram pressure applied during the heat cycle and the length of the heat cycle may vary, depending especially upon the size of the sheet of the electronic inlays 202. For example, the cycle time may be in the range of 10-15 minutes.

Subsequent to the above heat cycle, the laminator 204 applies a chill cycle to the assembly 222 during which time the ram pressure of the laminator 204 is increased, preferably by approximately 25% until the platens 206 and 208 have cooled to approximately 40° F. to 65° F. for approximately 10-15 minutes. The finished assembly 222 may then be removed from the laminator 204 for additional processing.

After the assembly 222 is removed from the laminator 204, the assembly can have a layer of printing ink applied to either the top overlay, the bottom overlay, or both. This may be accomplished using a wide variety of printing techniques such as offset printing, letterpress printing, screen printing, roller coating, spray printing, litho-printing, and other suitable printing techniques. In addition, after the top and bottom overlays are applied to the electronic overlay sheet, the sheet can be cut to form individual electronic cards.

From the disclosure of the present application, it is possible to provide an electronic inlay for the production of electronic cards in which the application of overlays onto the electronic inlays can be accomplished with existing equipment used in the industry today. Thus, a company that produces credit cards, for example, can easily make electronic cards in a more cost effective manner since there is a reduction in equipment costs.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present intention. The scope of the present invention is to be defined as set forth in the following claims.

What is claimed is:

1. An electronic inlay, comprising:
   a circuit board, having a top surface and a bottom surface;
   a plurality of circuit components attached to the top surface of the circuit board;
   a bottom cover sheet directly and uniformly attached to the bottom surface of the circuit board over their entire common surfaces;
   a top cover sheet positioned above the top surface of the circuit board; and
   a layer of injected thermosetting material between the bottom cover sheet and the top cover sheet.

2. The electronic inlay of claim 1, wherein the overall thickness of the electronic inlay is less than 0.033 inches.

3. The electronic inlay of claim 1, wherein the overall thickness of the electronic overlay is less than 0.028 inches.

4. The electronic inlay of claim 1, wherein the overall thickness of the electronic overlay is greater than 0.016 inches.

5. The electronic inlay of claim 1, further comprising a heat seal coating on a surface of the top cover sheet.

6. The electronic inlay of claim 1, further comprising a heat seal coating on a surface of the bottom cover sheet.

7. The electronic inlay of claim 1, wherein the layer of injected thermosetting material comprises polyurea.

8. The electronic inlay of claim 1, wherein the top and bottom cover sheets comprise polyvinyl chloride.

9. The electronic inlay of claim 1, wherein the injected thermosetting material can withstand hot lamination process temperatures in a range of 250 to 320° F.

10. An electronic card comprising:
    an electronic inlay comprising:
    a circuit board, having a top surface and a bottom surface;
    a plurality of circuit components attached to the top surface of the circuit board;
    a bottom cover sheet directly and uniformly attached to the bottom surface of the circuit board over their entire common surfaces;
    a top cover sheet positioned above the top surface of the circuit board; and
    a layer of injected thermosetting material between the bottom cover sheet and the top cover sheet;
    a top overlay attached to a top surface of the electronic inlay; and
    a bottom overlay attached to a bottom surface of the electronic inlay.

11. The electronic card of claim 10, further comprising a first heat seal coating disposed on the top cover sheet and a second heat seal coating disposed on bottom cover sheet.

12. The electronic card of claim 10, wherein the layer of injected thermosetting material comprises polyurea.

13. The electronic card of claim 10, wherein the top and bottom cover sheets comprise polyvinyl chloride.

14. The electronic card of claim 10, wherein the top and bottom overlays comprise polyvinyl chloride.

15. The electronic card of claim 10, wherein the injected thermosetting material can withstand hot lamination process temperatures in a range of 250 to 320° F.

16. A method for manufacturing an electronic inlay, comprising:
    providing a circuit board having a top surface and a bottom surface;
    affixing a plurality of circuit components onto the top surface of the circuit board;
    affixing the bottom surface of the circuit board to a bottom cover sheet using a pressure sensitive adhesive tape or a spray-on adhesive;
    loading the circuit board and bottom cover sheet into an injection molding apparatus;
    loading a top cover sheet positioned above a top surface of the circuit board into the injection molding apparatus;
    injecting a thermosetting polymeric material between the top and bottom cover sheets; and
    applying a heat seal coating on the top and bottom cover sheets.

17. The method of claim 16, wherein the thermosetting polymeric material can withstand hot lamination process temperatures in a range of 250 to 320° F.

18. A method for manufacturing an electronic card, comprising:
    providing a circuit board having a top surface and a bottom surface;
    affixing a plurality of circuit components onto the top surface of the circuit board;
    affixing the bottom surface of the circuit board to a bottom cover sheet using a pressure sensitive adhesive tape or a spray-on adhesive;
    loading the circuit board and bottom cover sheet into an injection molding apparatus;
    loading a top cover sheet positioned above a top surface of the circuit board into the injection molding apparatus;
    injecting a thermosetting polymeric material between the top and bottom cover sheets to form an electronic inlay;
    removing the electronic inlay; and
    providing a top overlay and a bottom overlay for attachment to the top cover sheet and bottom cover sheet, respectively of the electronic inlay.

19. The method of claim 18, wherein the thermosetting polymeric material comprises polyurea.

20. The method of claim 18, further comprising:
    placing the electronic inlay between the top overlay and the bottom overlay to create an assembly;
    placing the assembly in a laminator; and
    performing a hot lamination process on the assembly.

21. The method of claim 20, wherein a hot seal coating is applied to the top and bottom cover sheets before being placed in the laminator.

22. The method of claim 20, wherein the hot lamination process is performed at hot lamination process temperatures in a range of 250 to 320° F.

23. An electronic inlay, comprising:
- a circuit board, having a top surface and a bottom surface;
- a plurality of circuit components attached to the top surface of the circuit board;
- a top cover sheet positioned above the top surface of the circuit board; and
- a layer of injected thermosetting material between the circuit board and the top cover sheet.

24. The electronic inlay of claim 23, wherein the overall thickness of the electronic inlay is less than 0.033 inches.

25. The electronic inlay of claim 23, wherein the overall thickness of the electronic overlay is less than 0.028 inches.

26. The electronic inlay of claim 23, wherein the overall thickness of the electronic overlay is greater than 0.016 inches.

27. The electronic inlay of claim 23, further comprising a heat seal coating on a surface of the top cover sheet.

28. The electronic inlay of claim 23, further comprising a heat seal coating on the bottom surface of the circuit board.

29. The electronic inlay of claim 23, wherein the layer of injected thermosetting material comprises polyurea.

30. The electronic inlay of claim 23, wherein the top cover sheet comprises polyvinyl chloride.

31. The electronic inlay of claim 23, wherein the injected thermosetting material may withstand hot lamination process temperatures in a range of 250 to 320° F.

32. An electronic card comprising:
- an electronic inlay comprising:
- a circuit board, having a top surface and a bottom surface;
- a plurality of circuit components attached to the top surface of the circuit board;
- a top cover sheet positioned above the top surface of the circuit board;
- a layer of injected thermosetting material between the circuit board and the top cover sheet;
- a top overlay attached to a top surface of the electronic inlay; and
- a bottom overlay attached to the bottom surface of the circuit board.

33. The electronic card of claim 32, further comprising a first heat seal coating disposed on the top cover sheet and a second heat seal coating disposed on the bottom surface of the circuit board.

34. The electronic card of claim 32, wherein the layer of injected thermosetting material comprises polyurea.

35. The electronic card of claim 32, wherein the top cover sheet comprises polyvinyl chloride.

36. The electronic card of claim 32, wherein the top and bottom overlays comprise polyvinyl chloride.

37. The electronic card of claim 32, wherein the injected thermosetting material may withstand hot lamination process temperatures in a range of 250 to 320° F.

38. A method for manufacturing an electronic inlay, comprising:
- providing a circuit board having a top surface and a bottom surface;
- affixing a plurality of circuit components onto the top surface of the circuit board;
- loading the circuit board into an injection molding apparatus;
- loading a top cover sheet positioned above a top surface of the circuit board into the injection molding apparatus;
- injecting a thermosetting polymeric material between the top and cover sheet and the circuit board; and
- applying a heat seal coating on the top cover sheet and the bottom surface of the circuit board.

39. The method of claim 38, wherein the thermosetting polymeric material may withstand hot lamination process temperatures in a range of 250 to 320° F.

40. A method for manufacturing an electronic card, comprising:
- providing a circuit board having a top surface and a bottom surface;
- affixing a plurality of circuit components onto the top surface of the circuit board;
- loading the circuit board into an injection molding apparatus;
- loading a top cover sheet positioned above a top surface of the circuit board into the injection molding apparatus;
- injecting a thermosetting polymeric material between the top cover sheet and the circuit board to make an electronic inlay;
- removing the electronic inlay; and
- providing a top overlay and a bottom overlay for attachment to the top cover sheet and bottom cover sheet, respectively of the electronic inlay.

41. The method of claim 40, wherein the thermosetting polymeric material comprises polyurea.

42. The method of claim 40, further comprising:
- placing the electronic inlay between the top overlay and the bottom overlay to create an assembly;
- placing the assembly in a laminator; and
- performing a hot lamination process on the assembly.

43. The method of claim 40, wherein a hot seal coating is applied to the top cover sheet and the circuit board before being placed in the laminator.

44. The method of claim 42, wherein the hot lamination process is performed at hot lamination process temperatures in a range of 250 to 320° F.

* * * * *